United States Patent
Woods et al.

(10) Patent No.: US 12,300,503 B2
(45) Date of Patent: May 13, 2025

(54) ETCHING OF METAL OXIDES USING FLUORINE AND METAL HALIDES

(71) Applicant: Applied Materials, Inc., Santa Clara, CA (US)

(72) Inventors: Keenan N. Woods, San Ramon, CA (US); Zhenjiang Cui, San Jose, CA (US); Mark Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 442 days.

(21) Appl. No.: 17/574,733

(22) Filed: Jan. 13, 2022

(65) Prior Publication Data
US 2022/0139720 A1    May 5, 2022

Related U.S. Application Data

(63) Continuation of application No. 16/898,595, filed on Jun. 11, 2020, now Pat. No. 11,239,091.

(60) Provisional application No. 62/860,217, filed on Jun. 11, 2019.

(51) Int. Cl.
*H01L 21/321* (2006.01)
*H01L 21/311* (2006.01)

(52) U.S. Cl.
CPC ............... *H01L 21/31116* (2013.01)

(58) Field of Classification Search
CPC ......... H01L 21/32136; H01L 21/32135; H01L 21/32133
See application file for complete search history.

(56) References Cited

U.S. PATENT DOCUMENTS

| | | | |
|---|---|---|---|
| 4,859,908 A | * | 8/1989 | Yoshida ............ C30B 31/22 315/111.41 |
| 2006/0141796 A1 | * | 6/2006 | Kim ............ H01L 29/1037 257/E21.655 |
| 2008/0064220 A1 | | 3/2008 | Fernandez et al. |
| 2010/0099264 A1 | | 4/2010 | Elers |
| 2016/0300718 A1 | | 10/2016 | Raley et al. |
| 2017/0159208 A1 | * | 6/2017 | Aigo ............ H01L 21/0262 |
| 2017/0243755 A1 | | 8/2017 | Tapily |
| 2017/0365478 A1 | | 12/2017 | George et al. |
| 2018/0047577 A1 | | 2/2018 | Clark et al. |
| 2018/0163312 A1 | | 6/2018 | Blomberg et al. |

(Continued)

FOREIGN PATENT DOCUMENTS

WO    2017205658 A1    11/2017

OTHER PUBLICATIONS

"PCT International Search Report and Written Opinion in PCT/US2020/037126 dated Sep. 23, 2020, 13 pages".

(Continued)

*Primary Examiner* — Thomas T Pham
(74) *Attorney, Agent, or Firm* — SERVILLA WHITNEY LLC

(57) ABSTRACT

Embodiments of this disclosure provide methods for etching oxide materials. Some embodiments of this disclosure provide methods which selectively etch oxide materials over other materials. In some embodiments, the methods of this disclosure are performed by atomic layer etching (ALE). In some embodiments, the methods of this disclosure are performed within a processing chamber comprising a nickel chamber material.

10 Claims, 6 Drawing Sheets

(56) References Cited

U.S. PATENT DOCUMENTS

| | | | |
|---|---|---|---|
| 2018/0166255 A1* | 6/2018 | Blomberg | H01L 21/31122 |
| 2018/0223437 A1* | 8/2018 | George | C23F 4/00 |
| 2019/0043726 A1 | 2/2019 | Yang et al. | |
| 2019/0189456 A1* | 6/2019 | Mullick | H01L 21/306 |
| 2019/0252154 A1* | 8/2019 | Samir | H01L 21/67069 |
| 2021/0175088 A1* | 6/2021 | Dezelah | C23F 1/32 |

OTHER PUBLICATIONS

Hartman, J. S., et al., "Mixed Tetrahaloborate Ions. Detection and Study by Nuclear Magnetic Resonance", Inorganic Chemistry, vol. 11, No. 5, 1972, Sep. 1971, 940-951.

Johnson, Nicholas R., et al., "WO3 and W Thermal Atomic Layer Etching Using "Conversion-Fluorination" and "Oxidation-Conversion-Fluorination" Mechanisms", ACS Appl. Mater. Interfaces 2017, 9, 34435-34447.

Lee, Younghee, et al., "Atomic Layer Deposition of AlF3 Using Trimethylaluminum and Hydrogen Fluoride", J. Phys. Chem. C 2015, 119, 14185-14194.

Lee, Younghee, et al., "Atomic Layer Etching of AlF3 Using Sequential, Self-Limiting Thermal Reactions with Sn (acac)2 and Hydrogen Fluoride", J. Phys. Chem. C 2015, 119, 25385-25393.

Lee, Younghee, et al., "Mechanism of Thermal Al2O3 Atomic Layer Etching Using Sequential Reactions with Sn (acac)2 and HF", Chem. Mater. Apr. 2015, 27, 3648-3657.

Lee, Younghee, et al., "Selectivity in Thermal Atomic Layer Etching Using Sequential, Self-Limiting Fluorination and Ligand-Exchange Reactions", Chem. Mater. 2016, 28, 7657-7665.

Lee, Younghee, et al., "Trimethylaluminum as the Metal Precursor for the Atomic Layer Etching of Al2O3 Using Sequential, Self-Limiting Thermal Reactions", Chem. Mater. Apr. 2016, 28, 2994-3003.

Putkonen, Matti, et al., "Atomic layer deposition of B2O3 thin films at room temperature", Thin Solid Films 514 (2006) 145-149.

Wille, H.W., et al., "Zur Darstellung von reinem Hafniumtribromid", Mit 2 Abbildungen.

* cited by examiner

ETCHING OF METAL OXIDES USING FLUORINE AND METAL HALIDES

CROSS-REFERENCE TO RELATED APPLICATIONS

This application is a continuation of U.S. application Ser. No. 16/898,595, filed Jun. 11, 2020, which claims priority to U.S. Provisional Application No. 62/860,217, filed Jun. 11, 2019, the entire disclosures of which are hereby incorporated by reference herein.

TECHNICAL FIELD

Embodiments of the disclosure generally relate to methods for the selective atomic layer etching of metal oxides. using fluorine and metal halide sources. In particular, some embodiments of the disclosure are directed to methods of selective atomic layer etching of metal oxides by fluorination and removal with metal halides. Some embodiments of the disclosure provide for alternate fluorine sources to HF, which may be undesirable from a manufacturing perspective.

BACKGROUND

As semiconductor devices continue to increase in design and material component complexity, the selective removal of materials has become critical for continued scaling and improvement of semiconductor devices.

Selective atomic layer etching (ALE) has emerged as a precise etching method that employs self-limiting surface reactions. Selective ALE of metal oxides (MOX) is particularly important for a number of semiconductor technologies but can be difficult to accomplish due to the inherent stability of these oxide materials. One such example is the selective removal of $HfO_2$ during recess etching of high-K metal gate architectures.

Selective removal of metal oxide and nitrides is critical for continued miniaturization and optimization in semiconductor manufacturing. While some etch processes exist, they are either not selective or rely on HF as the fluorine source. HF is toxic and introduces handling issues during manufacturing. Alternate fluorine sources for metal oxide etching which avoid these concerns are desirable for widespread adoption of an etch process.

Accordingly, there is a need for new fluorine and metal halide sources for the selective removal of metal oxides and metal nitrides.

SUMMARY

One or more embodiments of the disclosure are directed to an etch process comprising exposing a substrate surface having an oxide layer thereon to a fluorinating agent to convert a portion of the oxide layer to a fluoride layer. The fluoride layer is exposed to a halide etchant to remove the fluoride layer.

Additional embodiments of the disclosure are directed to an etch process comprising exposing a substrate surface having an oxyhydride layer thereon to a fluorinating agent to form a fluoride layer. The fluoride layer is exposed to a halide etchant to remove the fluoride layer.

Further embodiments of the disclosure are directed to an etch process comprising exposing a substrate surface having an oxide layer and a second material to a fluorinating agent in a process chamber comprising a nickel chamber material to selectively convert a portion of the oxide layer to a fluoride layer. The second material comprises one or more of TiN, SiN, TaN, SiO, AlO, LaO, carbon, silicon or combinations thereof. The fluoride layer is exposed to a halide etchant to remove the fluoride layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
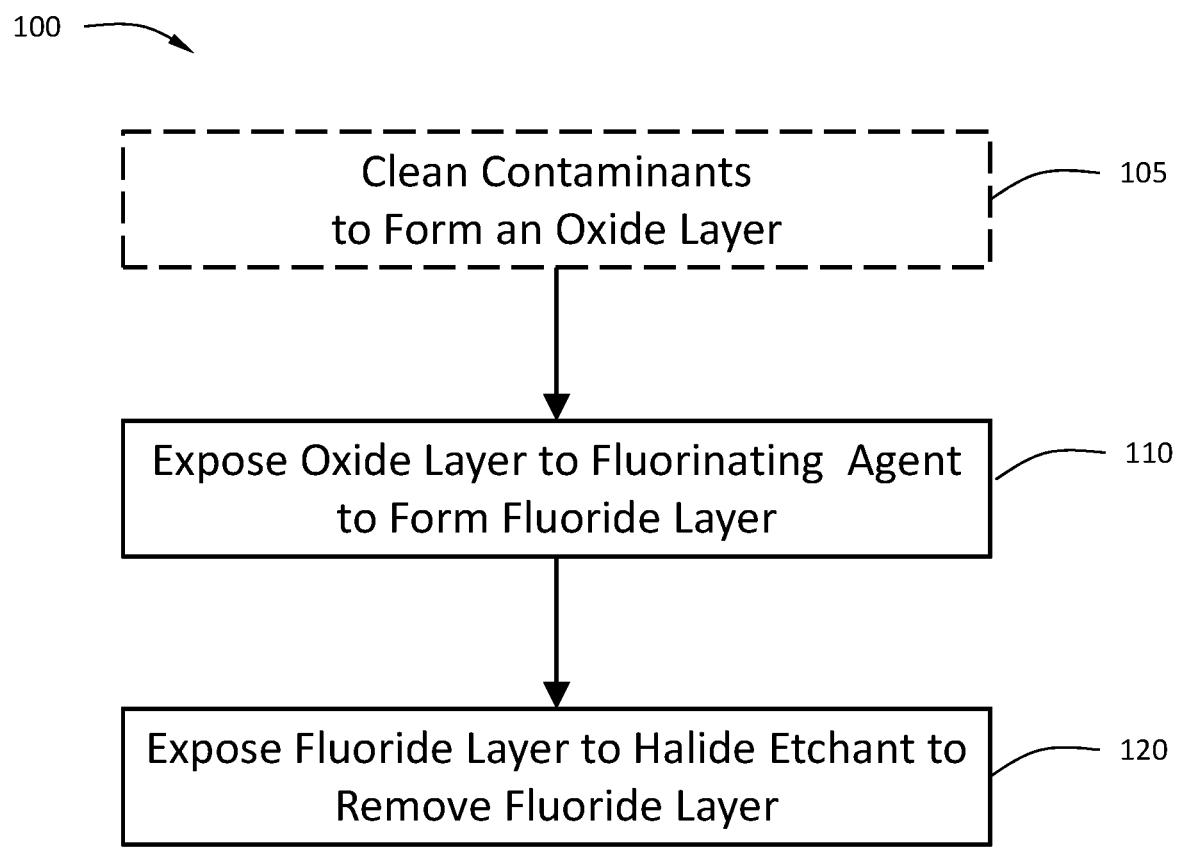
FIG. 1 is a flowchart of an exemplary method according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on or etching from a substrate can mean both a bare substrate and a substrate with one or more films or features deposited or formed thereon A "substrate," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been removed from a substrate surface, the exposed surface of the newly exposed film, layer, or substrate becomes the substrate surface.

As used in this specification and the appended claims, the terms "precursor", "reactant", "reactive gas" and the like are used interchangeably to refer to any gaseous species that can react with the substrate surface.

"Atomic layer etching" (ALE) or "cyclical etching" is a variant of atomic layer deposition wherein a surface layer is removed from a substrate. As used herein, ALE refers to the sequential exposure of two or more reactive compounds to etch a layer of material on a substrate surface. The substrate, or portion of the substrate, is exposed separately to the two or more reactive compounds which are introduced into a reaction zone of a processing chamber.

In a time-domain ALE process, exposure to each reactive compound is separated by a time delay to allow each compound to adhere and/or react on the substrate surface and then be purged from the processing chamber. These reactive compounds are said to be exposed to the substrate sequentially.

In one aspect of a time-domain ALE process, a first reactive gas (i.e., a first reactant or compound A) is pulsed into the reaction zone followed by a first time delay. Next, a second reactant or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the etching process so that only the purge gas flows during the time delay between pulses of reactive compounds. The reactive compounds are alternatively pulsed until a desired film or film thickness is removed from the substrate surface.

The ALE process of pulsing compound A, purge gas, compound B and purge gas is referred to as a cycle. A cycle can start with either compound A or compound B and continue the respective order of the cycle until a predetermined thickness is removed.

In a spatial ALE process, different portions of the substrate surface, or material on the substrate surface, are exposed simultaneously to the two or more reactive compounds so that any given point on the substrate is substantially not exposed to more than one reactive compound simultaneously. As used in this regard, the term "substantially" means, as will be understood by those skilled in the art, that there is the possibility that a small portion of the substrate may be exposed to multiple reactive gases simultaneously due to diffusion, and that the simultaneous exposure is unintended.

In an embodiment of a spatial ALE process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Some embodiments of the present disclosure relate to methods for etching or removing metal oxides from a substrate surface. Some methods of this disclosure advantageously utilize fluorinating agents other than HF.

Some methods of this disclosure advantageously provide methods which selectively remove metal oxide materials over other substrate materials. As used in this regard, the term "selectively removing one film over another film", and the like, means that a first amount is removed from the first surface or material while and a second amount is removed from the second surface or material, where the second amount is less than the first amount, or no film is removed from the second surface. The term "over" used in this regard does not imply a physical orientation of one surface on top of another surface, rather a relationship of the thermodynamic or kinetic properties of the chemical reaction with one surface relative to the other surface.

The selectivity of a process is generally expressed as a multiple of etch rate or a ratio of etch rates between different surfaces. For example, if one surface is etched 25 times faster than a different surface, the process would be described as having a selectivity of 25:1. In this regard, higher ratios indicate more selective processes.

One or more embodiments of the disclosure are directed to methods for the removal of metal oxides. In some embodiments, a substrate comprising an oxide surface can be treated with a fluorine source (also referred to as a fluorinating agent) and then purged, followed by treatment with a metal halide (also referred to as a halide etchant) and a subsequent purge. This cycle may be repeated to remove a predetermined thickness of metal oxide.

Figure 4A:
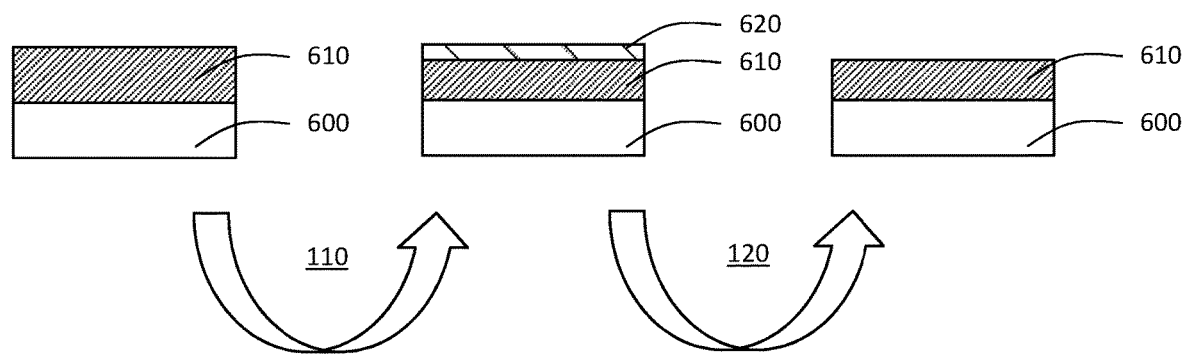
FIGS. 4A-4E are a cross sectional view of an exemplary substrate during processing according to one or more embodiment of the disclosure.

Referring to FIGS. 1 and 4A, a method 100 begins at operation 110 with a substrate 600 comprising an oxide layer 610 being exposed to a fluorinating agent to form a fluoride layer 620. The method 100 continues at operation 120 with the fluoride layer 620 being exposed to a halide etchant to remove the fluoride layer 620. An exemplary reaction scheme for the method 100 shown in FIGS. 1 and 4A is provided by Scheme 1.

Scheme 1:

Metal oxide+Fluorine Source→Metal Fluoride Layer  (1)

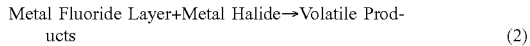

Metal Fluoride Layer+Metal Halide→Volatile Products  (2)

In some embodiments, as shown in Scheme 1, the oxide layer 610 comprises a metal oxide. In these embodiments, the fluoride layer 620 may be referred to as a metal fluoride layer. In some embodiments, the metal oxide comprises one or more of hafnium oxide, tungsten oxide, molybdenum oxide, titanium oxide or combinations thereof. In some embodiments, the metal oxide comprises or consists essentially of hafnium oxide.

As used in this regard, a material consists essentially of a stated material if the material is greater than or equal to about 95%, 98%, 99% or 99.5% of the stated material on an atomic basis.

The fluorinating agent may comprise any suitable reactant for forming fluoride terminations on at least the surface of the oxide layer. In some embodiments, the fluorinating agent comprises one or more of HF, $NF_3$, plasmas thereof or combinations thereof. In some embodiments, the fluorinating agent consists essentially of HF. In some embodiments, the fluorinating agent comprises substantially no HF. In some embodiments, the fluorinating agent consists essentially of $NF_3$.

As used in this regard, a reactant consists essentially of a stated species if the reactant is greater than or equal to about 95%, 98%, 99% or 99.5% of the stated species on a molar basis, excluding any diluents or other inert (non-reactive) species.

As used in this regard, a reactant comprises substantially none of a stated species comprises less than or equal to about 5%, 2%, 1% or 0.5% of the reactant is comprised of the stated species, excluding any diluents or other inert (non-reactive) species.

In some embodiments, the fluorinating agent comprises one or more of an organofluoride, an organooxyfluoride, a metal fluoride or combinations thereof. In some embodiments, an organofluoride has a general formula of $C_xH_yF_z$, where x is 1-16, y is 0-33 and z is 1-34. In some embodiments, an organooxyfluoride has a general formula of $C_xH_yO_wF_z$, where x is 1-16, y is 0-33, w is 1-8 and z is 1-34.

In some embodiments, a metal fluoride has a general formula of $MF_z$, where M is selected from one or more of molybdenum, tungsten, vanadium, niobium, titanium or tantalum and z is 1-6. In some embodiments, the metal fluoride comprises or consists essentially of $MoF_6$, $WF_6$, $VF_3$, $VF_4$, $VF_5$, $NbF_5$, $TiF_4$, or $TaF_5$.

In some embodiments, the fluorinating agent is coflowed with an additional gas. In some embodiments, the additional gas is selected from one or more of $O_2$, $N_2O$, $NH_3$ or $H_2$.

After forming the fluoride layer, the fluoride layer 620 is exposed to a halide etchant to remove the fluoride layer 620. In some embodiments, the halide etchant is referred to as a metal halide. In some embodiments, the halide etchant comprises one or more species with a general formula of $EX_3$, where E comprises one or more of aluminum (Al) or boron (B), and X comprises one or more of Cl, Br or I. In some embodiments, the halide etchant comprises or consists essentially of $BCl_3$.

In some embodiments, the halide etchant comprises or consists essentially of one or more species with a general formula of MXy, where M comprises one or more of Ti, Sn, Mo, W or Nb, X comprises one or more of Cl, Br or I, and y is 1-6. In some embodiments, the halide etchant comprises or consists essentially substantially one species with a general formula of $MX_y$, where M comprises one or more of Ti, Sn, Mo, W or Nb, X comprises one or more of Cl or Br, and y is 1-6.

In some embodiments, the exposure of the oxide layer to the fluorinating agent creates a fluoride layer with a thickness of at most one monolayer on average. Without being bound by theory, it is believed that the surface terminations of the oxide layer react with the fluorinating agent to create fluoride terminations on the surface of the oxide layer. This surface reaction is limited to the exposed surface of the oxide layer and affects only the top layer of atoms of the oxide layer. Accordingly, in some embodiments, the method 100 removes a thickness of less than or equal to one monolayer of the oxide layer.

In some embodiments, the method 100 is repeated. After removal of the bulk fluoride layer, a new layer of oxide layer is exposed. The method 100 may be repeated to remove a predetermined amount or thickness of the oxide layer.

Figure 4B:
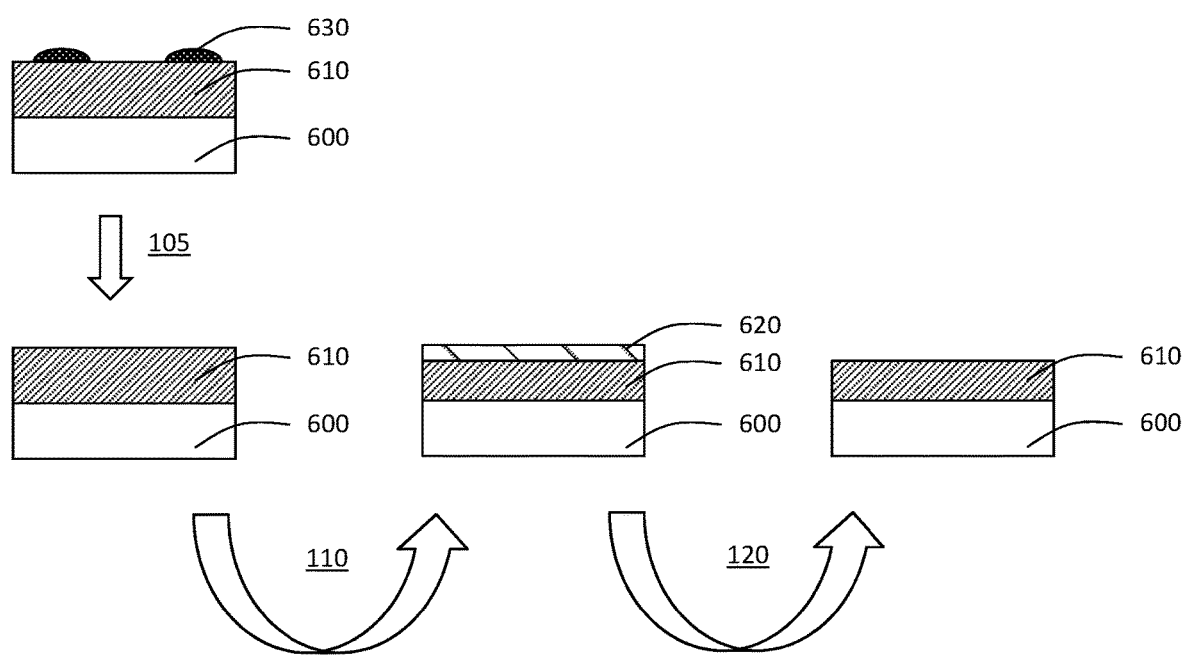

Additional embodiments are directed to methods of removing etch residues or other contaminants from a metal oxide surface before performing the method 100 described above to etch the oxide layer. Referring to FIGS. 1 and 4B, for these embodiments, the method 100 begins at operation 105 where contaminants 630 are cleaned from an oxide layer 610 on a substrate 600. Once the contaminants 630 are removed from the surface of the oxide layer 610, the method 100 continues as described above by exposing the oxide layer 610 to the fluorinating agent to form the fluoride layer 620 and exposing the fluoride layer 620 to the halide etchant to remove the fluoride layer 620.

In some embodiments, the contaminants comprise a carbon film or moisture on the surface of the oxide layer 610. Without being bound by theory it is believed that these residues may interfere with the fluorination and removal of the oxide layer 610. In some embodiments, an etch process is performed before the disclosed method 100 which results in the etch residues or contaminants comprising moisture and/or a carbon film.

At operation 105, the etch residue or contaminants 630 may be removed by exposing the substrate to a radical cleaning process. In some embodiments, the radicals of the cleaning process comprises one or more of H*, OH*, O* or $H_2O$*. In some embodiments, the radicals are generated by passing a radical gas over a hot wire. In some embodiments, the radicals are generated by forming a plasma from a radical gas. In some embodiments, the plasma is generated by a remote plasma source.

An exemplary reaction scheme for the method 100, including operation 105, is provided by Scheme 2.
Scheme 2:

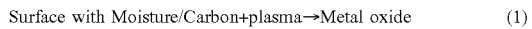
Surface with Moisture/Carbon+plasma→Metal oxide    (1)

Metal oxide+Fluorine Source→Metal Fluoride Layer    (2)

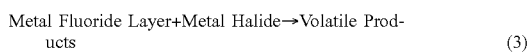
Metal Fluoride Layer+Metal Halide→Volatile Products    (3)

Figure 4C:
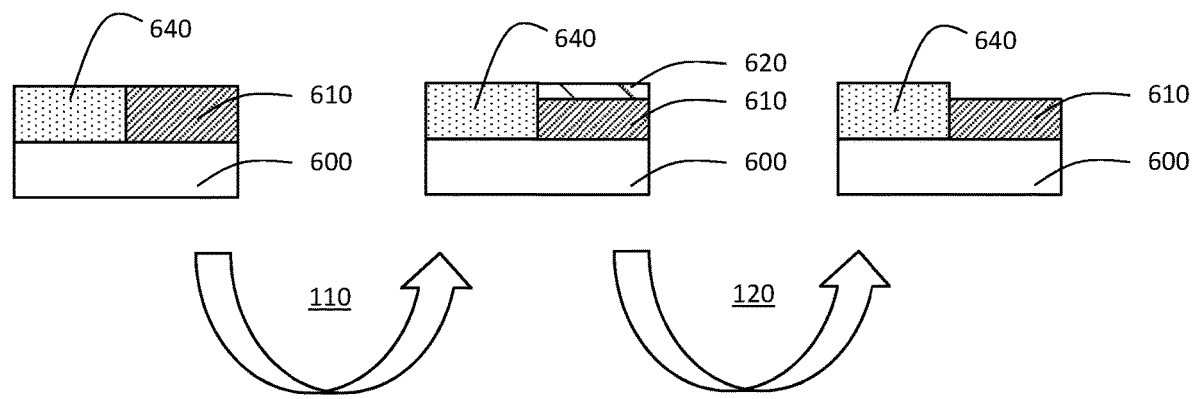

As shown in FIG. 4C, in some embodiments, the method 100 selectively removes the oxide layer 610 relative to other materials 640 on the exposed surface of the substrate 600. In some embodiments, the other materials may comprise or consist essentially of TiN, TaN, SiN, $SiO_2$, $Al_2O_3$, carbon-based materials, or combination thereof.

In some embodiments, the selectivity for oxide layer 610 removal relative to other materials 640 is greater than or equal to about 5:1, greater than or equal to about 10:1, greater than or equal to about 15:1, greater than or equal to about 20:1, or greater than or equal to about 25:1.

In a specific embodiment, a hafnium oxide layer is etched by exposure to $NF_3/H_2$ and $BCl_3$. This process is selective to TiN, SiN, $SiO_2$, $Al_2O_3$ and carbon with a selectivity greater than or equal to about 20:1.

Additional embodiments of the disclosure are directed to methods to increase the selectivity of the method 100 described above by performing the method in a process chamber comprising a nickel chamber material. In some embodiments, the nickel chamber material is found as part of one or more of a process kit, showerhead, pedestal, or confinement ring.

As above, the substrate 600 comprising the oxide layer 610 is exposed to a fluorinating agent to form a fluoride layer 620. The chamber is then purged. The fluoride layer is exposed to a halide etchant, and the chamber is again purged. This cycle may be repeated to remove a predetermined thickness of the oxide layer 610. The fluorinating agent and halide etchant used may be any of the fluorinating agents and/or halide etchants described above.

The inventors have surprisingly found that when performed in a process chamber comprising a nickel chamber material, the oxide layer is selectively removed over TiN, SiN, TaN, SiO, AlO, LaO and carbon as well as silicon. In some embodiments, the selectivity is greater than or equal to about 5:1, greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, greater than or equal to about 45:1, or greater than or equal to about 50:1 for the oxide layer relative to silicon.

Figure 2:
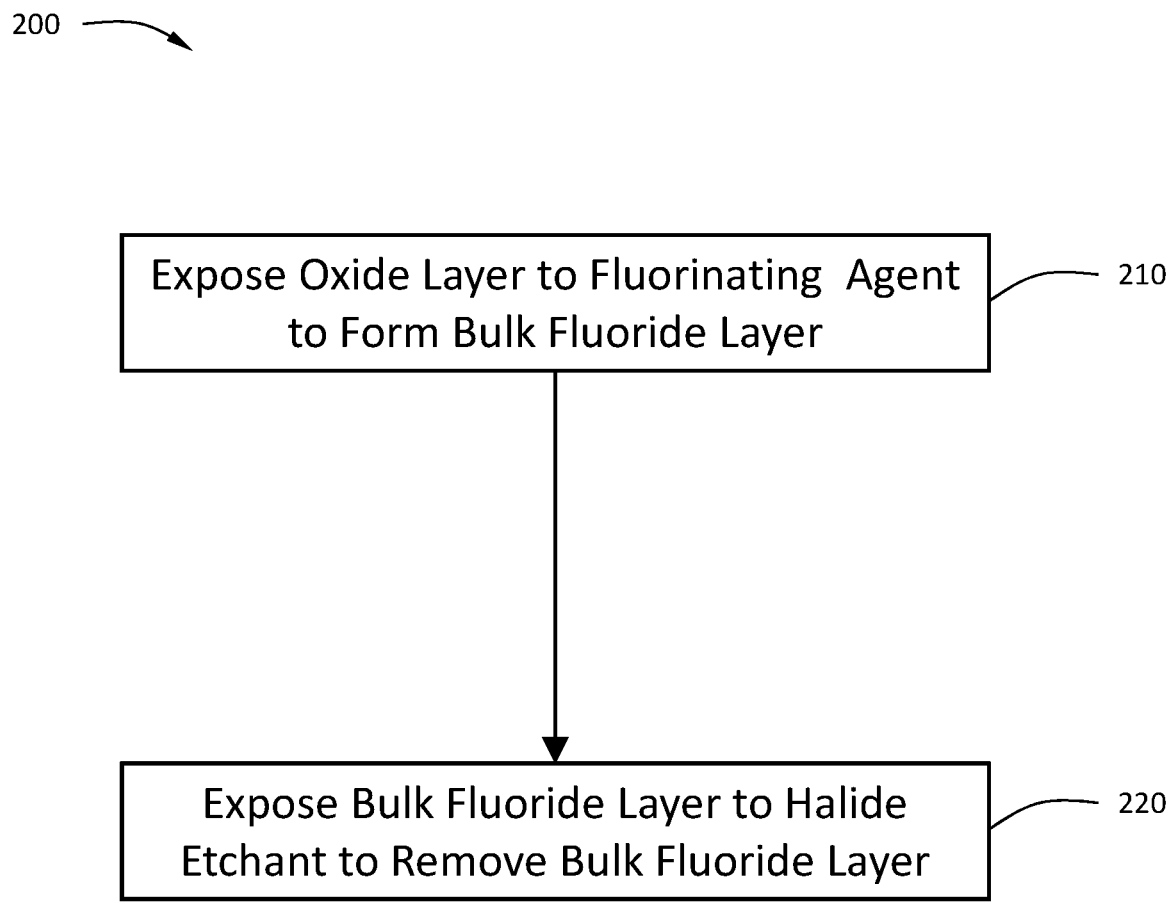
FIG. 2 is a flowchart of an exemplary method according to one or more embodiment of the disclosure.
Figure 4D:
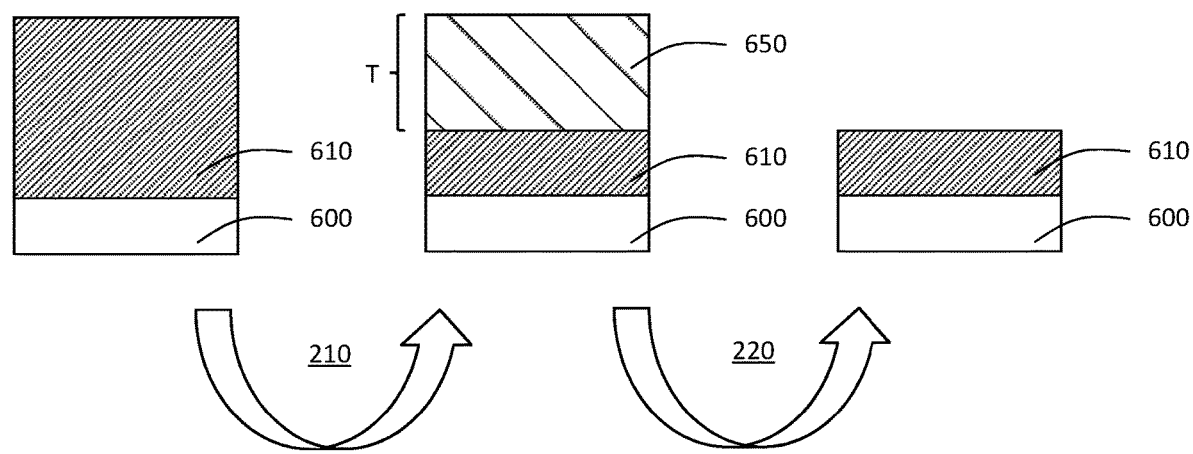

Some embodiments of this disclosure are directed to methods for removing a thickness of metal oxide greater than an atomic layer within a single process cycle. Referring to FIGS. 2 and 4D, a method 200 begins at operation 210 with a substrate 600 comprising an oxide layer 610 being exposed to a fluorinating agent to form a bulk fluoride layer 650 with a thickness T.

The fluorinating agent used in this method 200 may be any of the fluorinating agents described above with respect to method 100. To achieve the depth of fluorination, in some embodiments, the fluorinating agent may further comprise $H_2$.

In some embodiments, the thickness of the bulk fluoride layer is greater than or equal to about 5 Å, greater than or equal to about 10 Å, greater than or equal to about 15 Å, or greater than or equal to about 20 Å. In some embodiments, the thickness of the bulk fluoride layer is in a range of about 5 Å to about 30 Å, or in the range of about 7 Å to about 20 Å, or in the range of about 10 Å to about 15 Å.

The method 200 continues at operation 220 with the bulk fluoride layer 650 being exposed to a halide etchant to remove the bulk fluoride layer 650. The halide etchant used in method 200 may be any of the halide etchants described above with respect to method 100. An exemplary reaction scheme for the method 200 shown in FIG. 2 is provided by Scheme 3.

Scheme 3:

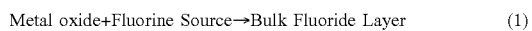

Metal oxide+Fluorine Source→Bulk Fluoride Layer    (1)

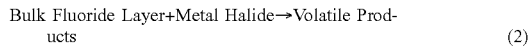

Bulk Fluoride Layer+Metal Halide→Volatile Products    (2)

Figure 3:
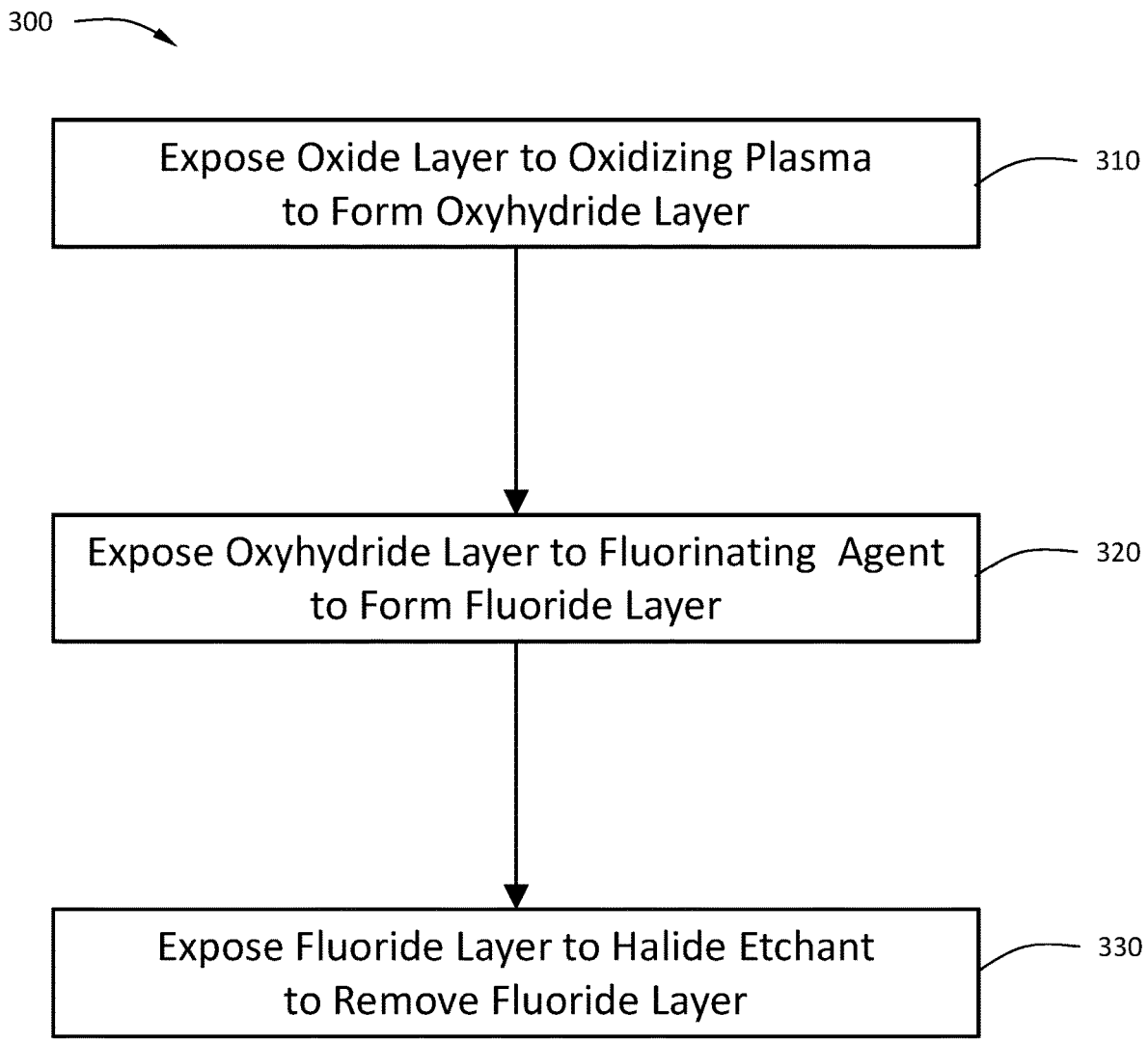
FIG. 3 is a flowchart of an exemplary method according to one or more embodiment of the disclosure.
Figure 4E:
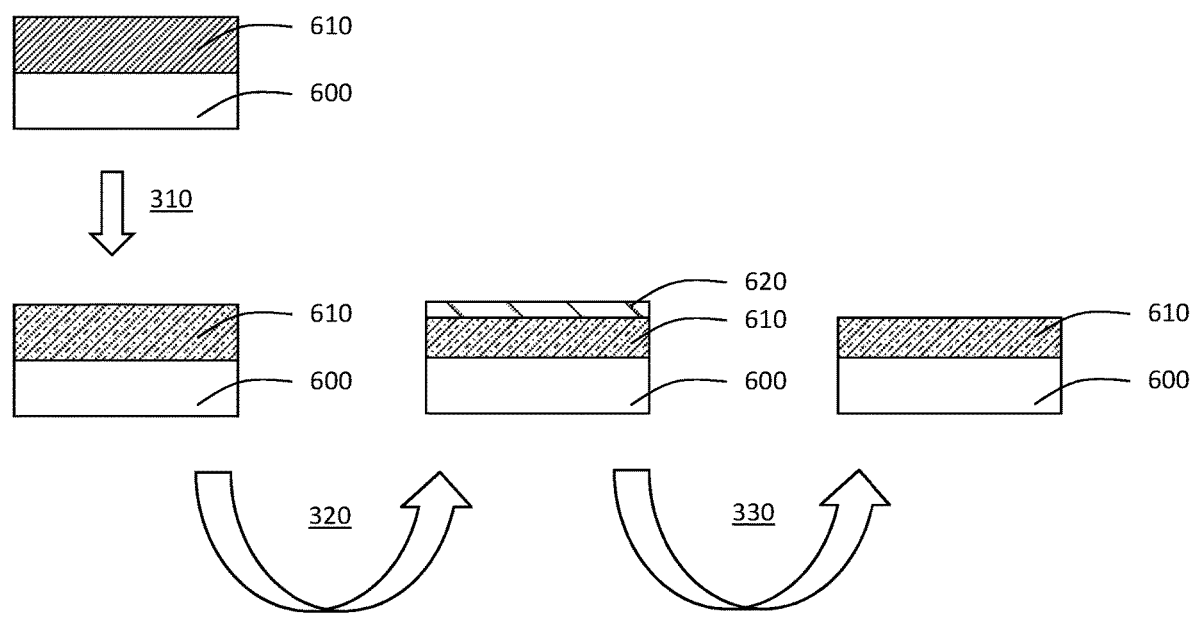

Some embodiments of the disclosure are directed to methods of etching a metal oxyhydride material rather than the oxide layer described above. Referring to FIGS. 3 and 4E, the method 300 begins at operation 310 by exposing an oxide layer 610 to an oxidizing plasma to form an oxyhydride layer 660.

The oxyhydride layer 660 may be formed by exposing the oxide layer to an oxidizing plasma. In some embodiments, the oxidizing plasma is a remote plasma. In some embodiments, the oxidizing plasma comprises radicals of one or more of water, peroxide, alcohols or combinations thereof. In some embodiments, the oxidizing plasma comprises OH* radicals.

The method 300 continues at operation 320 by exposing the oxyhydride layer 660 to a fluorinating agent to form a fluoride layer 670. The fluorinating agent used in this method 300 may be any of the fluorinating agents described above with respect to method 100.

The method 300 continues at operation 330 by exposing the fluoride layer to a halide etchant to remove the fluoride layer 670. The halide etchant used in method 300 may be any of the halide etchants described above with respect to method 100.

An exemplary reaction scheme for the method 300 shown in FIG. 3 is provided by Scheme 4.

In some embodiments, the method 300 is repeated to remove a predetermined thickness of the oxide layer 610 and/or oxyhydride layer 660.

Scheme 4:

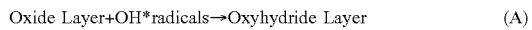

Oxide Layer+OH*radicals→Oxyhydride Layer    (A)

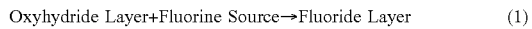

Oxyhydride Layer+Fluorine Source→Fluoride Layer    (1)

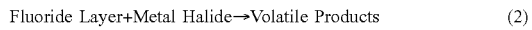

Fluoride Layer+Metal Halide→Volatile Products    (2)

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An etch process comprising:
exposing a substrate surface having a hafnium oxide layer thereon to a fluorinating agent to form a fluoride layer on the hafnium oxide layer; and
exposing the fluoride layer to a halide etchant to remove the fluoride layer, the halide etchant comprising a compound having the general formula $EX_3$, where E comprises one or more of aluminum (Al) or boron (B), and X comprises one or more of Cl, Br or I, wherein the substrate surface has at least one other material which comprises one or more of TiN, TaN, SiN, $SiO_2$, $Al_2O_3$, or carbon-based materials and the hafnium oxide layer is selectively etched over the at least one other material and wherein selectivity of the etch process is greater than or equal to about 10:1.

2. The etch process of claim 1, wherein the fluorinating agent comprises one or more of organofluorides having the general formula $C_xH_yF_z$, where x is 1-16, y is 0-33 and z is 1-34, organooxyfluorides having the general formula $C_xH_yO_wF_z$, where x is 1-16, y is 0-33, w is 1-8 and z is 1-34, metal fluorides, or combinations thereof.

3. The etch process of claim 1, wherein E comprises boron (B).

4. The etch process of claim 1, wherein E comprises aluminum (Al).

5. The etch process of claim 1, further comprising repeating exposures to the fluorinating agent and halide etchant to remove a predetermined thickness of the hafnium oxide layer.

6. The etch process of claim 1, wherein the fluorinating agent is coflowed with hydrogen ($H_2$) and the fluoride layer has a thickness in a range of about 10 Å to about 15 Å.

7. The etch process of claim 6, wherein the fluoride layer is formed in a process chamber comprising a nickel chamber material.

8. The etch process of claim 1, further comprising exposing the substrate surface to a cleaning plasma comprising one or more radicals of H*, OH*, O* or $H_2O$* before exposing the substrate surface to the fluorinating agent.

9. The etch process of claim 8, wherein the cleaning plasma removes a carbon film and/or moisture from the substrate surface.

10. The etch process of claim 9, wherein the carbon film and/or moisture is a result of an etch process.

* * * * *

UNITED STATES PATENT AND TRADEMARK OFFICE
CERTIFICATE OF CORRECTION

PATENT NO. : 12,300,503 B2
APPLICATION NO. : 17/574733
DATED : May 13, 2025
INVENTOR(S) : Keenan N. Woods et al.

Page 1 of 1

It is certified that error appears in the above-identified patent and that said Letters Patent is hereby corrected as shown below:

In the Specification

• Column 1, Line 33, replace "(MOX)" after "metal oxides" and before "is particu-" with "(MO$_X$)".

• Column 1, Line 37, replace "high-K" after "recess etching of" and before "metal gate" with "high-k".

Signed and Sealed this
Fifteenth Day of July, 2025

Coke Morgan Stewart
*Acting Director of the United States Patent and Trademark Office*